(12) United States Patent
Yamada et al.

(10) Patent No.: US 7,772,862 B2
(45) Date of Patent: Aug. 10, 2010

(54) ALIGNMENT METHOD, TIP POSITION DETECTING DEVICE AND PROBE APPARATUS

(75) Inventors: Hiroshi Yamada, Nirasaki (JP); Masaru Suzuki, Nirasaki (JP); Tetsuji Watanabe, Nirasaki (JP); Takeshi Kawaji, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/416,455

(22) Filed: Apr. 1, 2009

(65) Prior Publication Data

US 2009/0251163 A1 Oct. 8, 2009

(30) Foreign Application Priority Data

Apr. 2, 2008 (JP) .............................. 2008-096646

(51) Int. Cl.
*G01R 31/02* (2006.01)
(52) U.S. Cl. ..................................................... 324/758
(58) Field of Classification Search ........................ None
See application file for complete search history.

(56) References Cited

U.S. PATENT DOCUMENTS

| | | | | | |
|---|---|---|---|---|---|
| 5,644,245 | A | * | 7/1997 | Saitoh et al. ................. | 324/754 |
| 5,657,394 | A | * | 8/1997 | Schwartz et al. ............. | 382/151 |
| 7,009,415 | B2 | * | 3/2006 | Kobayashi et al. .......... | 324/757 |
| 2007/0296427 | A1 | | 12/2007 | Kono | |
| 2008/0231300 | A1 | * | 9/2008 | Yamada et al. ............... | 324/758 |
| 2009/0212804 | A1 | * | 8/2009 | Yamada et al. ............... | 324/758 |

FOREIGN PATENT DOCUMENTS

| | | |
|---|---|---|
| JP | 2-224260 | 9/1990 |
| JP | 5-67059 | 3/1993 |
| JP | 2005-79253 | 3/2005 |
| JP | 2007-324340 | 12/2007 |

* cited by examiner

*Primary Examiner*—Paresh Patel
(74) *Attorney, Agent, or Firm*—Oblon, Spivak, McClelland, Maier & Neustadt, L.L.P.

(57) ABSTRACT

An alignment method is used in implementation of electric characteristic inspection of an object to be inspected via electric contact between the object disposed on a movable mounting table and probes. The alignment method includes detecting tip positions of the probes by using the tip position detecting device, detecting the tip positions of the probes, previously detected by the tip position detecting device, by using the second imaging unit, transferring needle marks of the probes onto a soft member provided at the tip position detecting device by allowing the probes to come into contact with the soft member, detecting the needle marks of the probes formed on the soft member by using the first imaging unit, and detecting inspection electrodes of the object corresponding to the probes by using the first imaging unit.

12 Claims, 12 Drawing Sheets

ALIGNMENT METHOD, TIP POSITION DETECTING DEVICE AND PROBE APPARATUS

FIELD OF THE INVENTION

The present invention relates to an alignment method, a tip position detecting device and a probe apparatus for use in implementation of electric characteristic inspection of an object to be inspected, such as a semiconductor wafer. More particularly, the present invention relates to an alignment method, a tip position detecting device and a probe apparatus, capable of implementing alignment of an object to be inspected and a plurality of probes with a high accuracy, thereby increasing inspection reliability.

BACKGROUND OF THE INVENTION

When electric characteristic inspection is performed on an object to be inspected, such as a semiconductor wafer, by using a plurality of probes, for example, tips of the probes provided at a probe card are imaged by using a camera to detect tip positions of the probes, and the probes are made into contact with electrode pads of the object, thereby implementing the inspection. The detection of the tip positions of the probes using a camera requires time for the camera to focus on the probe tips. Consequently, a long time is inevitably required to align the object and the probe card. Thus, conventionally, for example, the alignment has been implemented on some selected probes, rather than being implemented on all the probes.

However, in case of microelectrode pads, all the probes may not sufficiently contact the respective electrode pads and, thus, it is preferable to detect tip positions of all the probes if possible. Moreover, there may be a deviation in manufacturing probe cards and it is difficult to avoid such a deviation in manufacturing even the same type of probe cards. Thus, it requires further accurate detection of the probe tips.

Further, since probe card makers have developed various kinds of probe cards, it is necessary to develop an exclusive algorithm to perceive a three-dimensional image of probes whenever using any one of the probe cards. Since it takes enormous costs to develop such an exclusive algorithm, a technology for transferring an image of probes onto a two-dimensional film is required to facilitate the development of the algorithm.

For example, Patent Document 1 discloses a probing method for aligning probes and a wafer. In the disclosed method, needle marks are transferred onto an aligned wafer on a table, or a sheet additionally provided at the table, and a direction of the wafer is compared with a direction of the probes, to correct a direction of the table. Thereafter, an operation for aligning XY coordinates of a reference chip of the wafer with XY coordinates of the probes is carried out.

Patent Document 2 discloses a method for detecting states of tips of probes by using a transfer sheet. In the disclosed method, thermally expanded probes are made into press contact with a transfer sheet disposed on a supporting member next to a mounting table, thereby forming needle marks on the transfer sheet. Then, after detecting the needle marks on the transfer sheet, the thermally expanded probes are aligned with a wafer.

Patent Document 3 discloses a position alignment method. In the disclosed method, a direction and set positions of probes are perceived by detecting needle marks formed on a dummy wafer by using a camera.

However, Patent Document 1 does not disclose detection of probe tips as an important alignment factor. In Patent Document 2, XY coordinate data of the probes are acquired based on the needle marks formed on the transfer sheet. However, a depth of the needle marks should be detected to detect a height of probe tips and, thus, it is difficult to detect the height of the probe tips with a high accuracy. Further, in Patent Document 3 in which tip positions of probes are detected based on the needle marks formed on the dummy wafer, although XY coordinate data of probe tips can be acquired in the same way as the technology of Patent Document 2, Z coordinate data of the probe tips can be acquired only by using a camera.

To solve the above-described problems, the applicant of the present invention has proposed a method for detecting tip positions of probes with a high accuracy as disclosed in Patent Document 4. The conventional probe tip position detecting method will be explained in brief with reference to FIGS. 10A to 10G. In the conventional method, first, as shown in FIG. 10A, an upper CCD camera 1, which is provided at an alignment bridge of an alignment device (not shown), and a lower CCD camera 3, which is provided at a side of a mounting table 2, are focused on a target 4 installed to the mounting table 2, to obtain a reference position of the mounting table 2. Next, as shown in FIG. 10B, during movement of the mounting table 2, the upper camera 1 searches a tip position detecting device 6 used to detect tips of probes 5A of a probe card 5, and detects a position of an upper surface of the tip position detecting device 6, thereby acquiring x, y and z positions of the upper surface of the tip position detecting device 6 based on a position of the mounting table 2 at the time of detection. Thereafter, as shown in FIG. 10C, the lower CCD camera 3 detects a tip position of a dummy pin 7 provided at the alignment bridge. Continuously, as shown in FIG. 10D, the dummy pin 7 is made into contact with the tip position detecting device 6, the position of the upper surface of which was detected, to check whether or not the tip position detecting device 6 operates normally. If the tip position detecting device 6 operates normally, as shown in FIG. 10E, the position of the upper surface of the tip position detecting device 6 is detected again. After detecting the position of the upper surface of the tip position detecting device 6, as shown in FIG. 10F, the probes 5A of the probe card 5 are made into contact with the upper surface of the tip position detecting device 6, so that the tip position detecting device 6 detects x, y and z positions of tips of the probes 5A based on the position of the mounting table 2. Then, the mounting table 2 is moved by targeting the x, y and z positions of the tips of the probes 5A detected by the tip position detecting device 6, allowing the lower CCD camera 3 to rapidly detect the tips of the probes 5A with a high accuracy. In this case, the lower CCD camera 3 can be easily focused on the tips of the probes 5A because the positions of the tips of the probes 5A are already detected and known.

Although the technology of Patent Document 4 enables high accuracy detection of tip positions of the probes 5A, this detection requires many processes as shown in FIGS. 10A to 10F until detection of the probes 5A is completed. Therefore, a long time is inevitably required to detect the tip positions of the probes 5A.

[Patent Document 1] Japanese Patent Publication No. H5-067059

[Patent Document 2] Japanese Patent Laid-open Application No. 2005-079253

[Patent Document 3] Japanese Patent Laid-open Application No. H2-224260

[Patent Document 4] Japanese Patent Laid-open Application No. 2007-324340

SUMMARY OF THE INVENTION

In view of the above, the present invention provides an alignment method, a tip position detecting device and a probe apparatus capable of simplifying a process of detecting a height of probes such that an alignment of inspection electrodes of an object to be inspected and the probes can be implemented with a high accuracy within a short period of time, thereby increasing inspection reliability.

In accordance with a first aspect of the present invention, there is provided an alignment method for use in implementation of electric characteristic inspection of an object to be inspected via electric contact between the object disposed on a movable mounting table and probes, the alignment method being performed to align the object with the probes by using a first imaging unit movably arranged above the mounting table to capture an image of the object, a second imaging unit mounted to the mounting table to capture an image of the probes, and a tip position detecting device mounted to the mounting table to detect tips of the probes, the alignment method comprising: detecting tip positions of the probes by using the tip position detecting device; detecting the tip positions of the probes, which have been detected by the tip position detecting device, by using the second imaging unit; transferring needle marks of the probes onto a soft member provided at the tip position detecting device by allowing the probes to come into contact with the soft member; detecting the needle marks of the probes formed on the soft member by using the first imaging unit; and detecting inspection electrodes of the object corresponding to the probes by using the first imaging unit.

In the alignment method of the first aspect, the tip position detecting device may include a sensor unit to detect the tips of the probes, and a vertically movable contact member belonging to the sensor unit. Said detecting tip positions of the probes may include moving the tip position detecting device via a movement of the mounting table to allow the contact member to come into contact with the tips of the probes; moving the contact member toward the sensor unit via a further movement of the mounting table without bending of the probes; and detecting a movement beginning position of the contact member as the tip positions of the probes.

In the alignment method of the first aspect, in said moving the contact member, the probes may not cause damage to the soft member.

In the alignment method of the first aspect, in said moving the contact member, a current position of the contact member may be detected by using a displacement sensor.

In the alignment method of the first aspect, in said detecting a movement beginning position, the tip positions of the probes may be detected based on a detected result of the displacement sensor.

In accordance with a second aspect of the present invention, there is provided a tip position detecting device for use in implementation of electric characteristic inspection of an object to be inspected via electric contact between the object and probes, the tip position detecting device being used to detect tip positions of the probes, wherein the tip position detecting device includes a sensor unit to detect tips of the probes, wherein the sensor unit includes a sensor body, a contact member provided at the sensor body to be vertically movable, and a pressure applying tool to apply a predetermined pressure to the contact member such that the contact member is spaced apart from the sensor body by a predetermined distance, wherein the sensor body includes an elastic supporting device to elastically support the contact member with the predetermined pressure applied by the pressure applying tool, and wherein the contact member is moved downward to the sensor body when it comes into contact with the probes under the predetermined pressure, enabling detection of the tip positions of the probes.

In the tip position detecting device of the second aspect, the sensor unit may include a displacement sensor to detect a current position of the contact member.

In accordance with a third aspect of the present invention, there is provided a probe apparatus comprising a movable mounting table on which an object to be inspected is disposed, probes arranged above the mounting table, and a tip position detecting device provided at the mounting table to detect tip positions of the probes, wherein the tip position detecting device includes a sensor unit to detect tips of the probes, wherein the sensor unit includes a sensor body, a contact member provided at the sensor body to be vertically movable, and a pressure applying tool to apply a predetermined pressure to the contact member such that the contact member is spaced apart from the sensor body by a predetermined distance, wherein the sensor body includes an elastic supporting device to elastically support the contact member with the predetermined pressure applied by the pressure applying tool, and wherein the contact member is moved downward to the sensor body when it comes into contact with the probes under the predetermined pressure, enabling detection of the tip positions of the probes.

The probe apparatus of the third aspect may further include a needle mark transfer device provided at the mounting table to transfer needle marks of the probes.

In the probe apparatus of the third aspect, the sensor unit may include a displacement sensor to detect a current position of the contact member.

In the probe apparatus of the third aspect, the needle mark transfer device may include a detachable soft member.

In the probe apparatus of the third aspect, the needle mark transfer device may include a contact member to which the soft member is detachably attached, and an elevation drive unit which supports the contact member to be vertically movable.

In accordance with the aspects of the present invention, it is possible to provide an alignment method, a tip position detecting device and a probe apparatus capable of simplifying a process of detecting a height of probes such that an alignment of inspection electrodes of an object to be inspected and the probes can be implemented with a high accuracy within a short period of time, thereby increasing inspection reliability.

BRIEF DESCRIPTION OF THE DRAWINGS

The objects and features of the present invention will become apparent from the following description of embodiments, given in conjunction with the accompanying drawings, in which:

FIGS. 6A and 6B are views illustrating steps of FIGS. 5B and 5C, wherein FIG. 6A is a cross sectional view illustrating a step of forming needle marks as shown in FIG. 5B, and FIG. 6B is a cross sectional view illustrating a process of detecting XY coordinates of the needle marks as shown in FIG. 5C;

FIGS. 9A and 9B are explanatory views illustrating another tip position detecting device of the probe apparatus shown in FIG. 1, wherein FIG. 9A is a block diagram illustrating a state where a contact member is moved upward, and FIG. 9B is a cross sectional view illustrating a state where the contact member is moved down toward a sensor unit.

DETAILED DESCRIPTION OF THE EMBODIMENT

Figure 1:
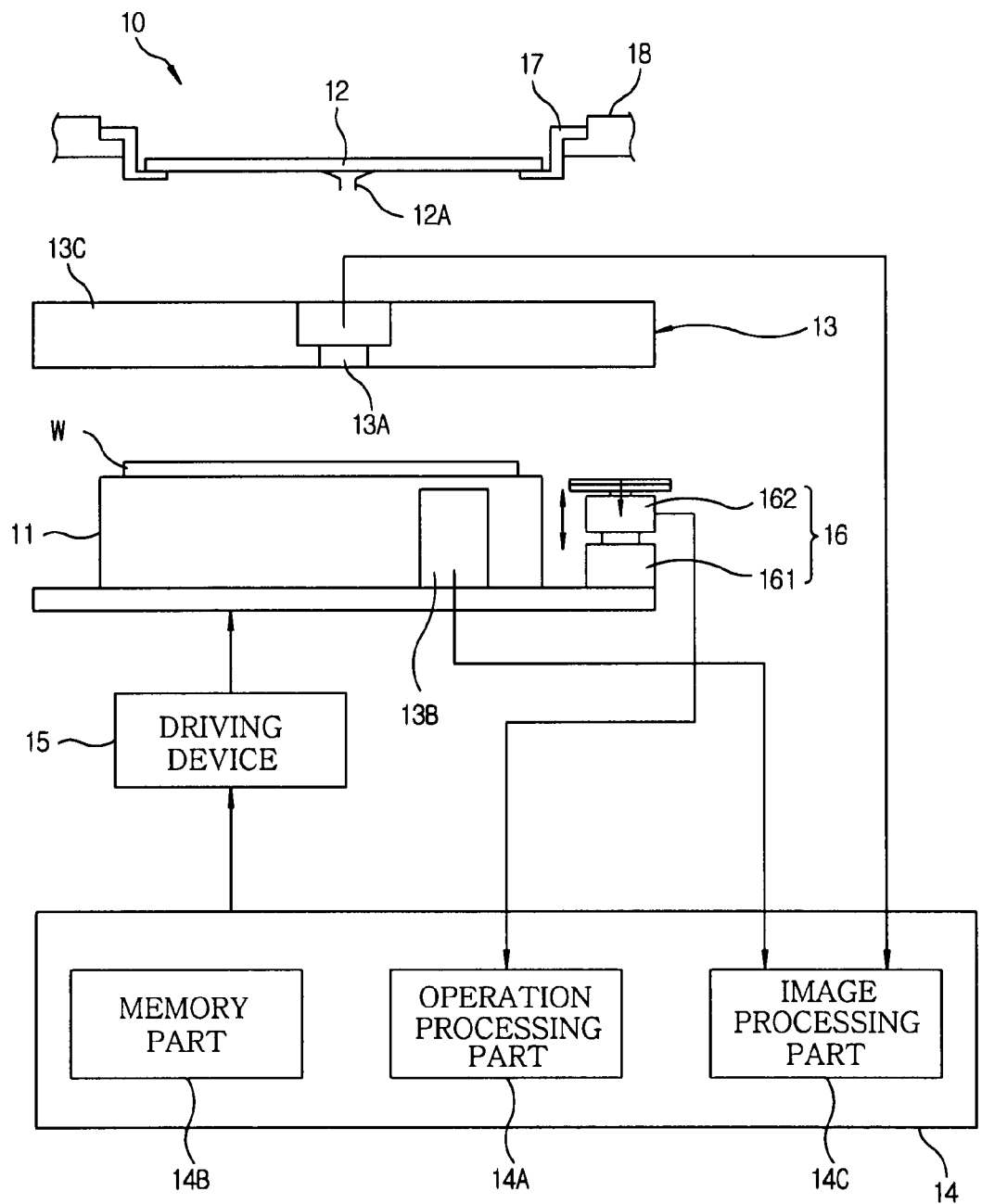
FIG. 1 illustrates a configuration of a probe apparatus in accordance with a first embodiment of the present invention.
Figure 2:
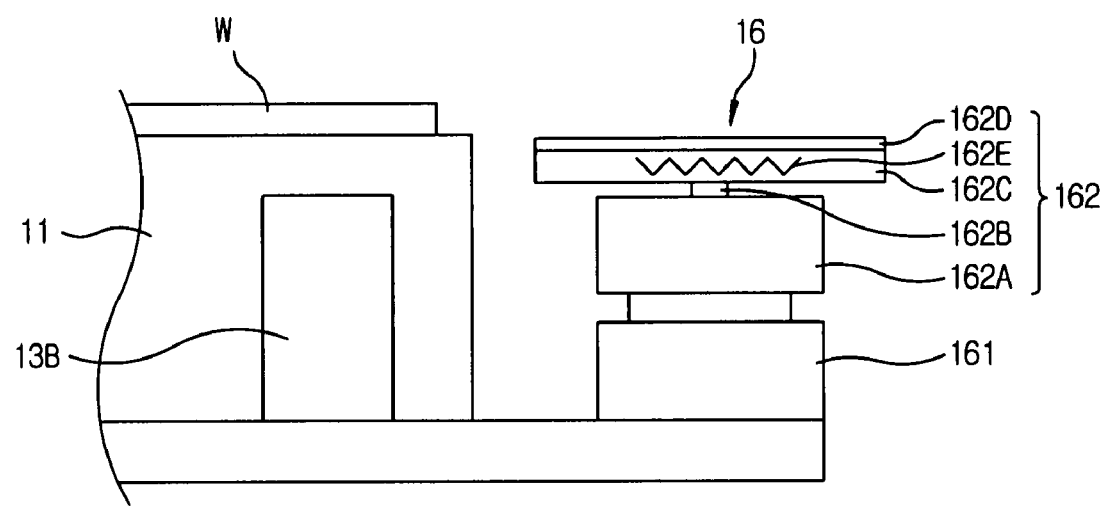
FIG. 2 is a side view illustrating a tip position detecting device used in the probe apparatus of FIG. 1.
Figure 3A:
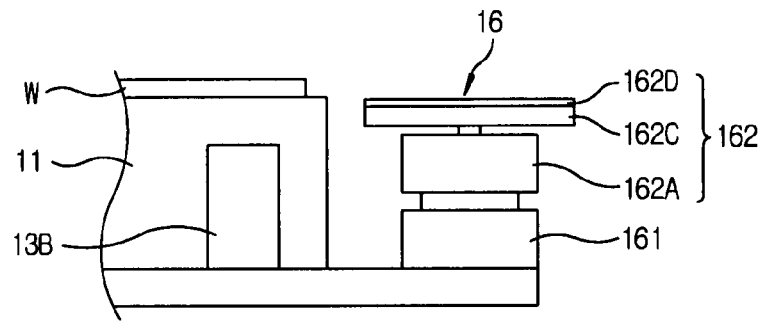
FIGS. 3A to 3C are explanatory views illustrating a process of detecting a height of an upper surface of the tip position detecting device, which is performed prior to an alignment method in accordance with the present invention.
Figure 3B:
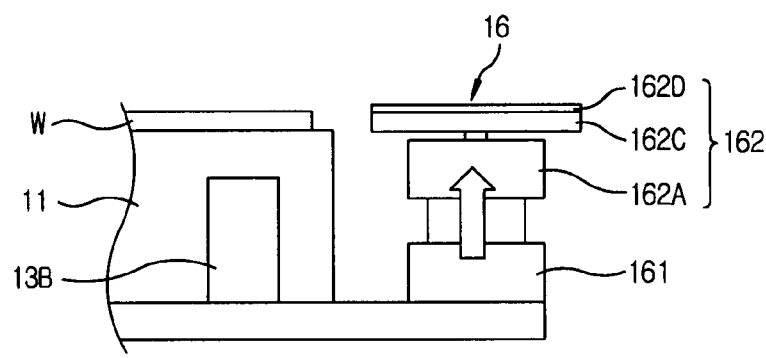
Figure 3C:
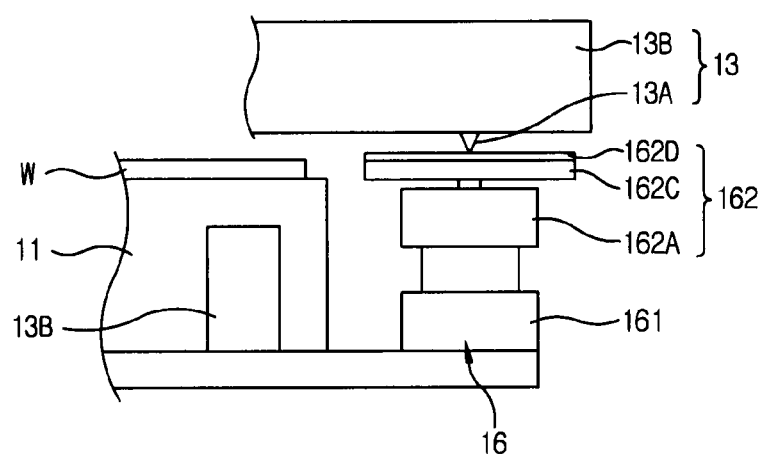
Figure 4A:
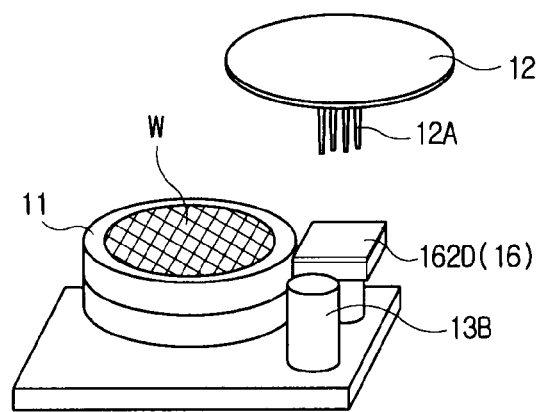
FIGS. 4A to 4C are perspective views illustrating main parts in the steps of the alignment method in accordance with the first embodiment of the present invention.
Figure 4B:
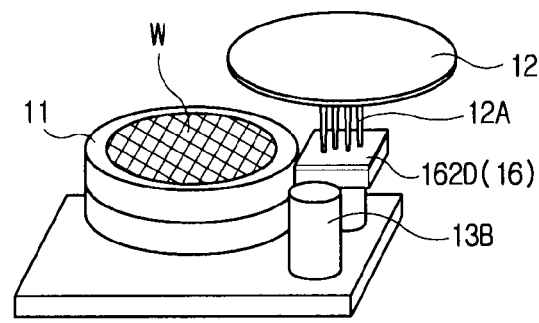
Figure 4C:
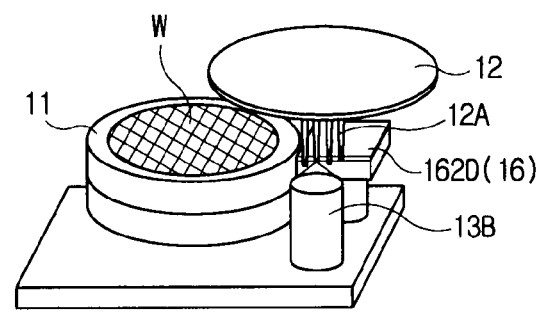
Figure 5A:
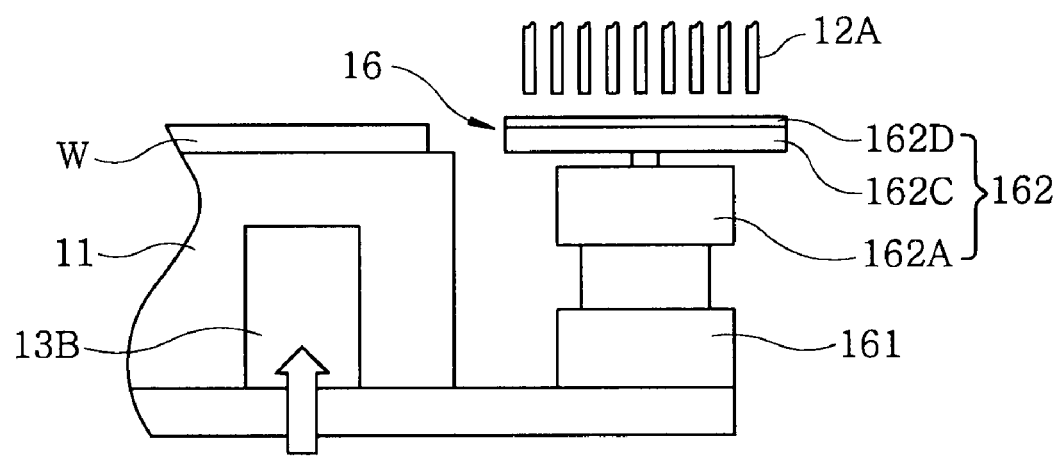
FIGS. 5A to 5D are explanatory views illustrating sequential steps of the alignment method, which are performed after the steps shown in FIG. 4.
Figure 5B:
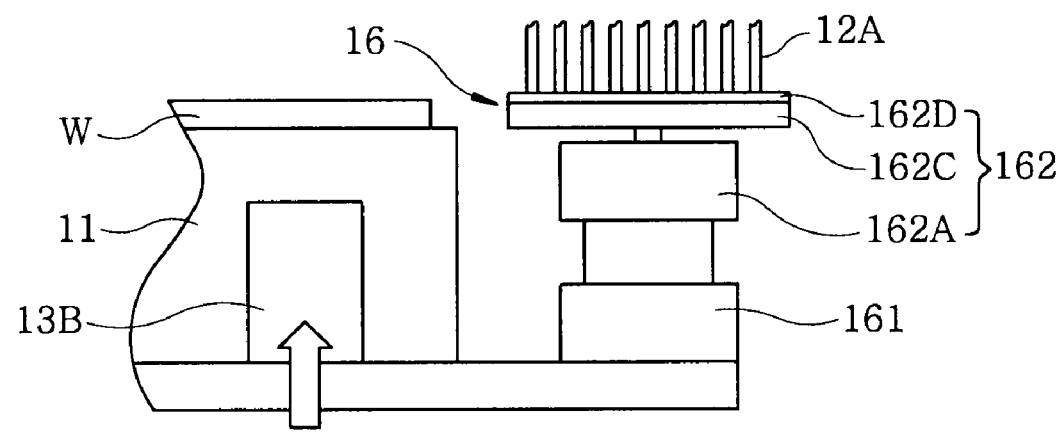
Figure 5C:
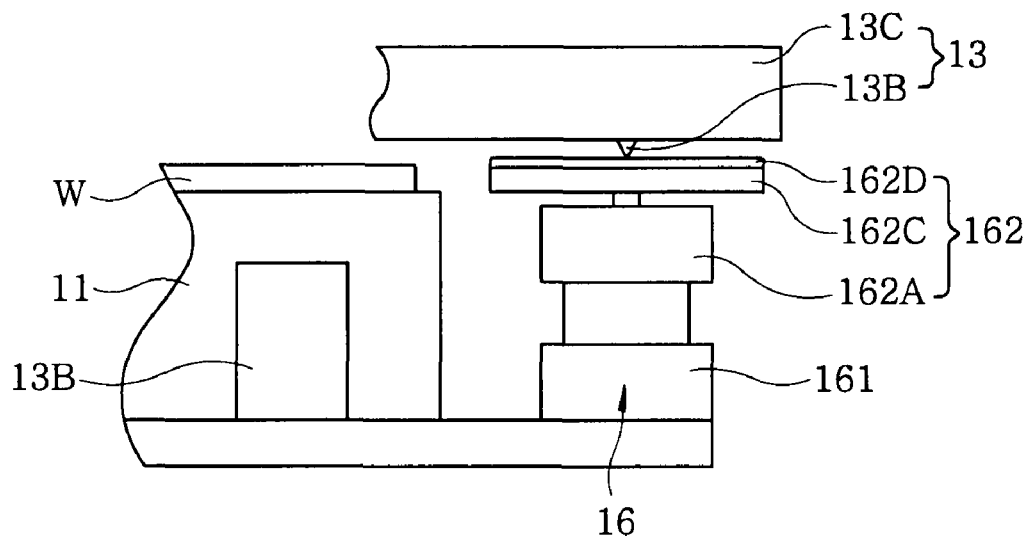
Figure 6A:
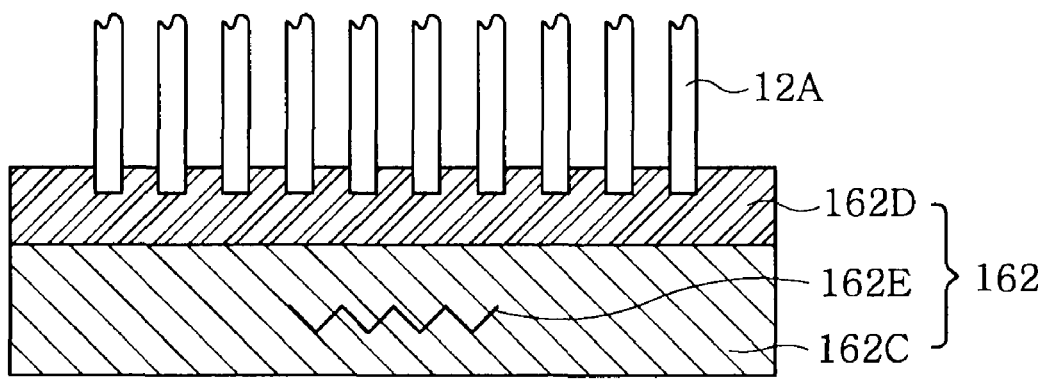
Figure 6B:
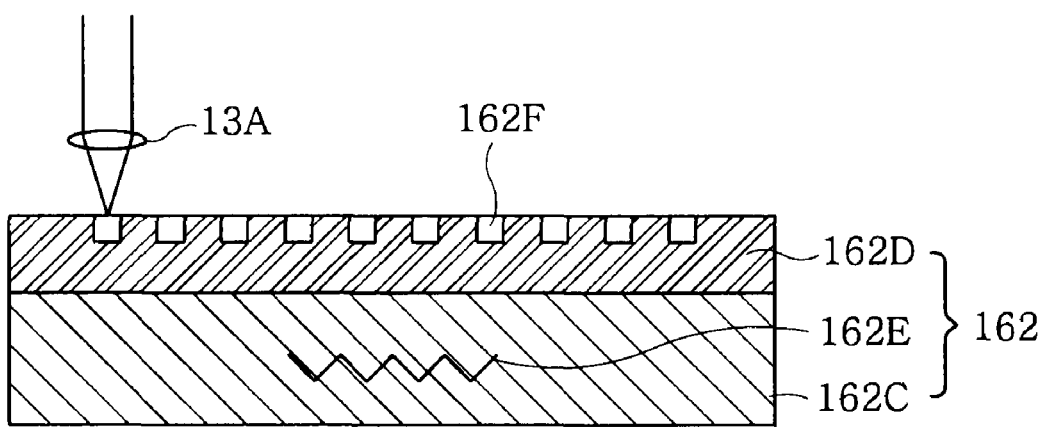
Figure 7:
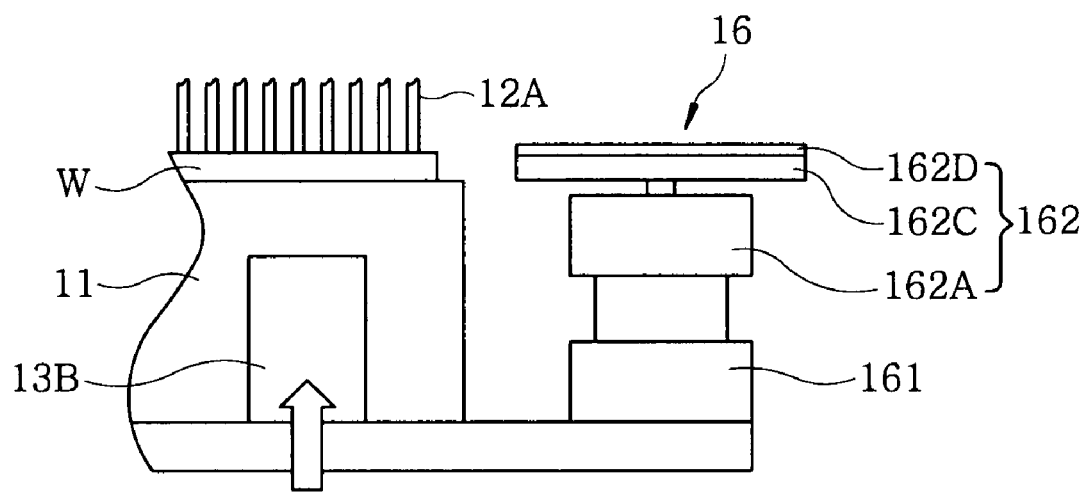
FIG. 7 is an explanatory view illustrating a final step of the alignment method shown in FIGS. 5A to 5D.
Figure 8:
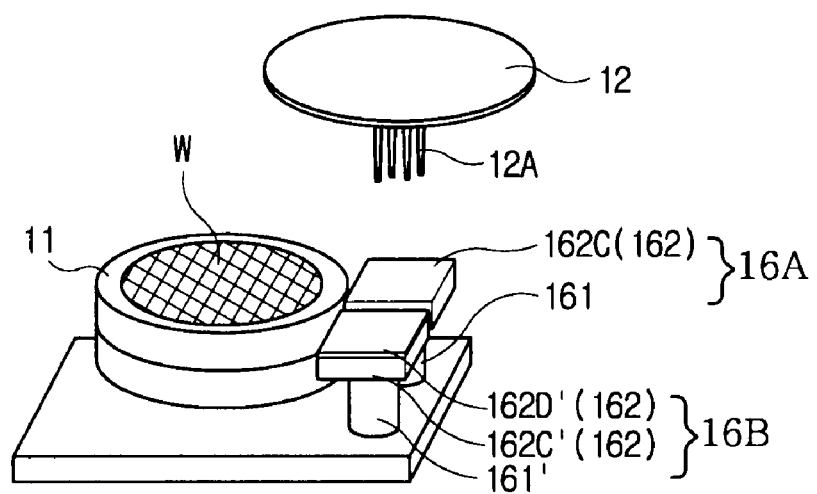
FIG. 8 is a perspective view illustrating main parts of the probe apparatus in accordance with another embodiment of the present invention.
Figure 9A:
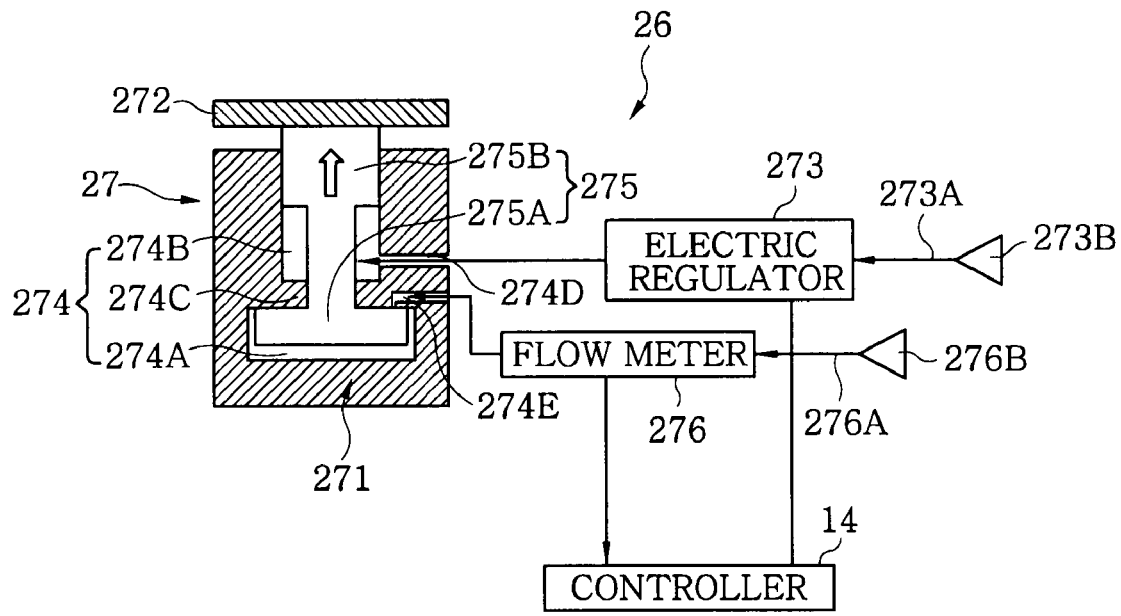
Figure 9B:
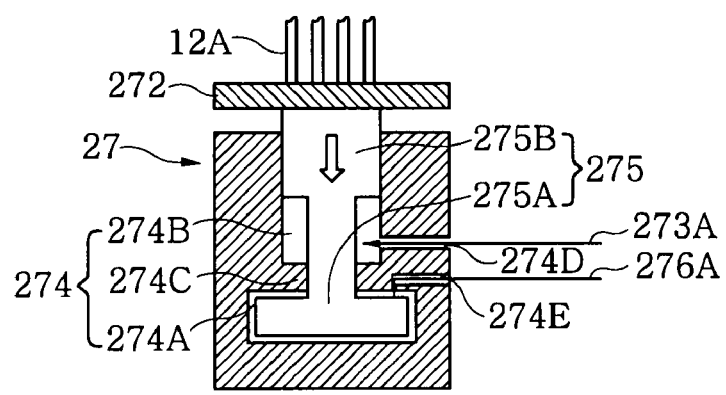
Figure 10A:
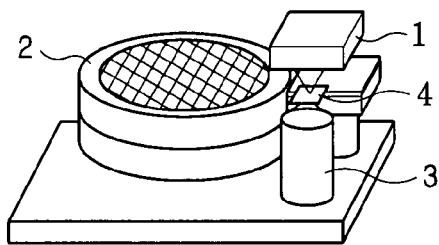
FIGS. 10A to 10G are explanatory views illustrating sequential steps of a conventional alignment method.
Figure 10B:
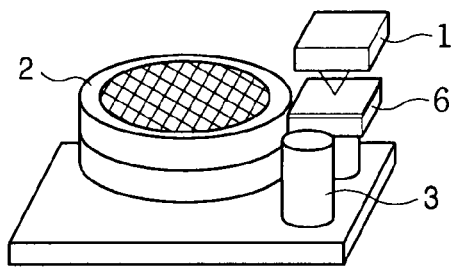
Figure 10C:
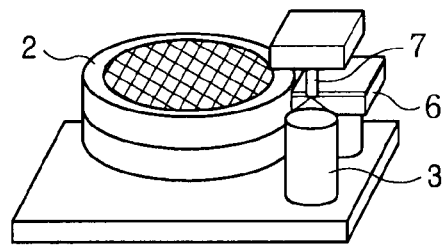
Figure 10D:
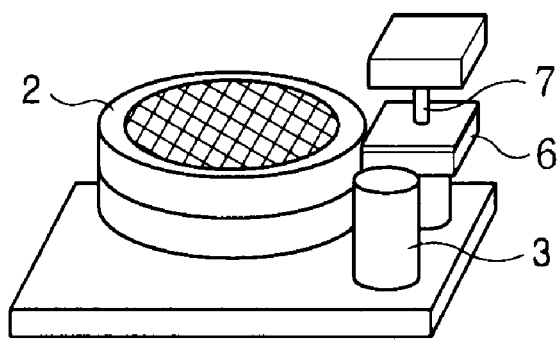
Figure 10E:
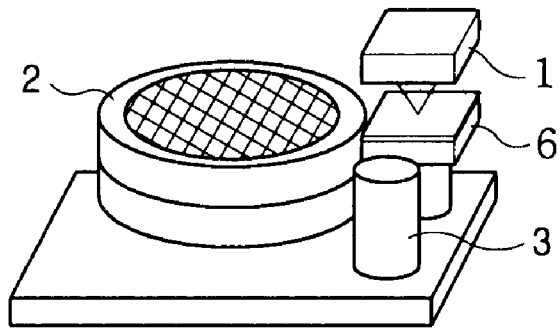
Figure 10F:
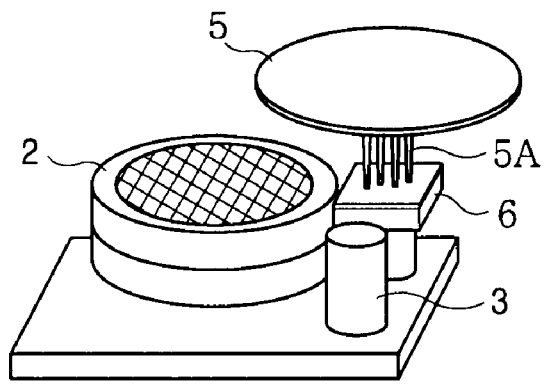
Figure 10G:
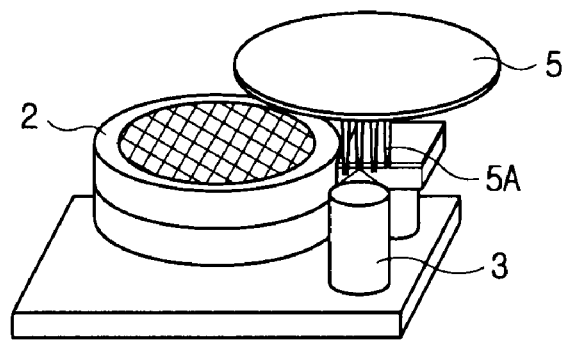

The embodiments of the present invention will be described with reference to FIGS. 1 to 9 which form a part hereof. FIG. 1 illustrates a configuration of a probe apparatus in accordance with a first embodiment of the present invention. FIG. 2 is a side view illustrating a tip position detecting device used in the probe apparatus of FIG. 1. FIGS. 3A to 3C are explanatory views illustrating a process of detecting a height of an upper surface of the tip position detecting device, which is performed prior to an alignment method in accordance with the present invention. FIGS. 4A to 4C are perspective views illustrating main parts in the steps of the alignment method in accordance with the first embodiment of the present invention. FIGS. 5A to 5D are explanatory views illustrating sequential steps of the alignment method, which are performed after the steps shown in FIG. 4. FIGS. 6A and 6B are views illustrating steps of FIGS. 5B and 5C, wherein FIG. 6A is a cross sectional view illustrating a step of forming needle marks as shown in FIG. 5B, and FIG. 6B is a cross sectional view illustrating a process of detecting XY coordinates of the needle marks as shown in FIG. 5C. FIG. 7 is an explanatory view illustrating a final step of the alignment method shown in FIGS. 5A to 5D. FIG. 8 is a perspective view illustrating main parts of the probe apparatus in accordance with another embodiment of the present invention. FIGS. 9A and 9B are explanatory views illustrating another tip position detecting device of the probe apparatus shown in FIG. 1, wherein FIG. 9A is a block diagram illustrating a state where a contact member is moved upward, and FIG. 9B is a cross sectional view illustrating a state where the contact member is moved down toward a sensor unit.

First Embodiment

First, a probe apparatus in accordance with the present embodiment will be described with reference to FIG. 1. The probe apparatus 10 of the present embodiment, as shown in FIG. 1, includes a movable wafer chuck 11 on which a semiconductor wafer W serving as an object to be inspected is mounted, a probe card 12 arranged above the wafer chuck 11, an alignment device 13 which implements an alignment of a plurality of probes 12A of the probe card 12 and the semiconductor wafer W mounted on the wafer chuck 11, and a controller 14 which controls components such as the wafer chuck 11 and the alignment device 13. The alignment device 13 is operated under control of the controller 14 to align electrode pads of the semiconductor wafer W mounted on the wafer chuck 11 and the probes 12A of the probe card 12. Then, the probes 12A are made into electric contact with the corresponding electrode pads, thereby conducting inspection of electric characteristics of the semiconductor wafer W.

The wafer chuck 11 is configured to move in directions of X, Y, Z and θ via a driving device 15 operated under control of the controller 14. A tip position detecting device 16 in accordance with the present embodiment is arranged at a side of the wafer chuck 11. The tip position detecting device 16 serves to detect tip positions of the probes 12A. As will be described later, the tip position detecting device 16 is used in a tip position detecting method and alignment method of the present invention.

The probe card 12 is attached to a head plate 18 of a prober chamber via a card holder 17. In a state where the probes 12A come into electric contact with the corresponding electrode pads of the semiconductor wafer W, the inspection of electric characteristics of the semiconductor wafer W is implemented based on signals from a tester (not shown).

The alignment device 13, as shown in FIG. 1, includes a first imaging unit (upper CCD camera) 13A used to capture an image of the semiconductor wafer W from above, a second imaging unit (lower CCD camera) 13B provided at a side of the wafer chuck 11 and used to capture an image of the probes 12A of the probe card 12 from below, and an alignment bridge 13C supporting the upper CCD camera 13A and movable in a first direction. The upper CCD camera 13A is moved from a standby position to a specific position (hereinafter, referred to as a probe center) right under the center of the probe card 12 via the alignment bridge 13C under control of the controller 14, and then stopped at the probe center. While the wafer chuck 11 is moved along X- and Y-axes during alignment, the upper CCD camera 13A located at the probe center captures an image of the electrode pads of the semiconductor wafer W mounted on the wafer chuck 11 from above. The captured image of the electrode pads is processed in an image processing part 14C, and then displayed on a screen (not shown). The lower CCD camera 13B captures an image of the desired probes 12A of the probe card 12 from below while the wafer chuck 11 is moved along X- and Y-axes during alignment. The captured image of the probes 12 is processed in the image processing part 14C, and then displayed on the screen (not shown). The upper CCD camera 13A, as will be described later, further captures an image of the tip position detecting device 16 provided at a side of the wafer chuck 11. Then, the captured image of the tip position detecting device 16 is processed and displayed on the screen.

The controller 14, as shown in FIG. 1, includes an operation processing part 14A, a memory part 14B, and the above-described image processing part 14C. The controller 14 controls the probe apparatus 10 by executing various programs stored in the memory part 14B. Accordingly, a program for implementing the alignment method in accordance with the present invention is stored in the memory part 14B. The alignment method is implemented according to the program read from the memory part 14B, and various data acquired in the alignment method are stored in the memory part 14B.

The tip position detecting device 16 in accordance with the present embodiment, as shown in FIGS. 1 and 2, includes an elevation drive unit 161, such as an air cylinder, and a sensor unit 162 which is moved up and down by the elevation drive unit 161. When detecting tip positions of the probes 12A, the sensor unit 162 is moved up from a standby position to substantially the same height as an upper surface of the semiconductor wafer W mounted on the wafer chuck 11 by the elevation drive unit 161.

For example, the sensor unit 162, as shown in FIG. 2, includes a sensor part 162A including a cylinder device and also serving as a displacement sensor, and a contact member 162C attached to an upper end of a piston rod 162B forming the cylinder device of the sensor part 162A, the contact member 162C being kept at a position moved upward from the sensor part 162A. The sensor unit 162 further includes a sheet-shaped soft member 162D detachably mounted on an upper surface of the contact member 162C, and a pressure applying tool (not shown), such as a compressed air source, which supplies compressed air into a cylinder of the sensor part 162A and applies a predetermined pressure to the contact member 162C via a piston (not shown) in the cylinder.

As shown in FIG. 2, the contact member 162C includes, e.g., a heater 162E therein. The heater 162E heats the soft member 162D to soften the soft member 162D, thereby removing needle marks of the probes 12A transferred onto the soft member 162D, as will be described later. Accordingly, it is possible to repeatedly use the soft member 162D.

A locking plate (not shown) is attached to a lower end of the piston rod 162B. The locking plate allows the contact member 162C to be kept at a position spaced upward from the sensor part 162A by a predetermined distance, so that the contact member 162C is elastically supported with respect to the sensor part 162A. A gap between the contact member 162C and the sensor part 162A becomes an elevation range of the contact member 162C. The sensor part 162A detects a distance of the gap and always monitors a position of the contact member 162C.

The pressure applying tool is configured to convert a pressure into a predetermined pressure such as a first pressure and a second pressure. The first pressure is a set pressure when detecting tip positions of the probes 12A, and is lower than the second pressure. The second pressure is a set pressure when transferring needle marks of the probes 12A onto an upper surface of the soft member 162D during alignment.

The sensor part 162A is provided with a pressure controller (not shown), such as a constant pressure valve, to maintain a predetermined constant pressure. The pressure controller slowly exhausts the compressed air as the contact member 162C is moved down toward the sensor part 162A, so that the first pressure is constantly maintained.

In a state where the contact member 162C is maintained at the first pressure, even if the contact member 162C comes into contact with the probes 12A via the soft member 162D as the tip position detecting device 16 is moved upward via the wafer chuck 11, the contact member 162C is moved down toward the sensor part 162A while maintaining initial tip positions without bending of the probes 12A. In a state where the contact member 162C is maintained at the first pressure, for example, each of the probes 12A imparts a specific load of 0.5 gf to the soft member 162D. The soft member 162D is made of a material having a sufficient hardness without casing damage to soft member 162D by preventing the probes 12A from pricking the soft member 162D with an excessive needle pressure when the soft member 162D comes into contact with the probes 12A at the first pressure. The material of the soft member 162D may be resin such as PO, PVC or the like.

In a state where the contact member 162C is maintained at the second pressure, the contact member 162C maintains an initial position thereof, rather than being moved downward to the sensor part 162A, even if the probes 12A apply a needle pressure to the soft member 162D. In this case, needle marks of the probes 12A are transferred onto the upper surface of the soft member 162D.

Next, an alignment method in accordance with a first embodiment of the present invention will be described with reference to FIGS. 3 to 7.

The alignment method in accordance with the present embodiment, as shown in FIGS. 3A to 3C, is implemented prior to electric characteristic inspection of the semiconductor wafer W. First, a first step of the alignment method is to detect tip positions of the probes 12A using the tip position detecting device 16. When the tip position detecting device 16 detects tip positions of the probes 12A, the sensor unit 162 is set at the first pressure.

Specifically, after the semiconductor wafer W is mounted on the wafer chuck 11, tip positions of the probes 12A of the probe card 12 are detected by using the alignment device 13 and the tip position detecting device 16. In this case, the upper CCD camera 13A of the alignment device 13 is moved to the probe center, i.e. a position right under the center of the probe card 12 via the alignment bridge 13C. Then, while the wafer chuck 11 is moved under the alignment bridge 13C, as represented by the arrow in FIG. 3B, the sensor unit 162 of the tip position detecting device 16 is moved upward from a standby state shown in FIG. 3A. In this case, the upward movement of the sensor unit 162 is set such that the upper surface of the soft member 162D on the contact member 162C has approximately the same level as the upper surface of the semiconductor wafer W mounted on the wafer chuck 11.

Thereafter, if the contact member 162C reaches a position right under the upper CCD camera 13A as shown in FIG. 3C as the wafer chuck 11 is moved along X- and Y-axes, the upper CCD camera 13A detects a height of the upper surface of the soft member 162D. After detecting the height of the upper surface of the soft member 162D, an operation of the sensor unit 162, i.e. downward movement of the contact member 162C required to detect the tip positions, and hardness of the soft member 162D and the like are confirmed. After a normal operation of the sensor unit 162 is confirmed, detection of the tip positions of the probes 12A is implemented.

To detect the tip positions of the probes 12A, as shown in FIG. 4A, the alignment bridge 13C is first retreated to a standby position thereof. Thereafter, as the wafer chuck 11 is moved upward from a Z-directional reference position thereof, the soft member 162D of the tip position detecting device 16 approaches the probes 12A, coming into contact with the probes 12A as shown in FIG. 4B.

If the wafer chuck 11 is further moved upward, the contact member 162C is pressed by the probes 12A through the soft member 162D, thereby being moved downward to the sensor part 162A. In this case, since the contact member 162C is elastically maintained at the first pressure, even if a needle pressure applies between the probes 12A and the soft member 162D as the wafer chuck 11 is moved upward, it is possible to prevent the probes 12A from damaging the soft member 162D (that is, prevent needle marks of the tips of the probes 12A from being transferred onto the soft member 162D) without bending of the probes 12A. As the wafer chuck 11 is moved upward, the contact member 162C is moved downward to the sensor part 162A by a distance corresponding to the upward movement of the wafer chuck 11 while being maintained at the first pressure, and a gap between the contact member 162C and the sensor part 162A is gradually reduced.

The sensor part 162A functions to monitor a distance between the sensor part 162A and the contact member 162C. If the gap between the sensor part 162A and the contact member 162C is changed by the downward movement of the contact member 162C, the sensor part 162A detects a distance of the gap and sends a detection signal to the controller 14. Once the controller 14 receives the detection signal, the operation processing part 14A compares a preset initial value of the gap with a detected value of the gap distance from the sensor part 162A, and calculates a height of the upper surface of the soft member 162D, i.e., a height of the tip positions of the probes 12A based on an a distance by which the wafer chuck 11 is moved upward from a reference position thereof until the detected value is equal to or less than an initial value. As described above, the contact member 162C begins to be moved downward without bending of the probes 12A and damage to the soft member 162D. Therefore, a beginning position of the downward movement can be detected as the height of the tips of the probes 12A with a high accuracy. The detected height of the tips of the probes 12A is stored as Z coordinate data in the memory part 14B of the controller 14.

It is noted that the soft member 162D is configured to have as a uniform thickness as possible, but is made of synthetic resin as described above. Accordingly, the soft member 162D has a limit to have a uniform thickness due to a variation in thickness, and also suffers from deterioration in smoothness after removal of needle marks of the probes 12A. Further, the recent type of the probe card 12 has an extremely delicate arrangement according to an ultra fine structure of the semiconductor wafer W and thus can be easily damaged. Consequently, even a slight error in the tip positions of the probes 12A may lead to damage to the probe card 12.

To solve the above-described problem, after the tip position detecting device 16 detects the height of the tips of the probes 12A as shown in FIGS. 4A and 4B, the lower CCD camera 13B provided at the side of the wafer chuck 11 is also used to detect the height of the tips of the probes 12A. In this case, since the height of the tips of the probes 12A is already detected by the tip position detecting device 16, the lower CCD camera 13B can easily detect the probes 12A by searching the probes 12A while focusing on the height detected by the tip position detecting device 16.

Specifically, after the height of the upper surface of the soft member 162D on the contact member 162C of the tip position detecting device 16 is detected, the tip position detecting device 16 is moved right under the probe card 12 via the wafer chuck 11 as shown in FIG. 4A,. Thereafter, as shown in FIG. 4B, the wafer chuck 11 is moved upward, and the tip positions of the probes 12A are detected by using the soft member 162D. Next, the wafer chuck 11 is moved downward and is horizontally moved, allowing the lower CCD camera 13B to search the probes 12A. In this case, since the x, y and z positions of the tips of the probes 12A are already detected, the lower CCD camera 13B can detect the probes 12A within a short period of time by focusing on the detected tip positions. Further, as shown in FIG. 4C, the lower CCD camera 13B can detect the height of the tips of the probes 12A with a high accuracy by, for example, detecting tip positions of a previously registered number (e.g., four) of probes 12A.

Subsequently, the wafer chuck 11 is returned to the Z-directional reference position thereof, and then a pressure applied to the contact member 162C is changed from the first pressure to the second pressure. Then, the wafer chuck 11 is moved upward as represented by the arrow in FIG. 5A to approach the probes 12A, and then the soft member 162D is made into contact with the probes 12A and the wafer chuck 11 is overdriven as represented by the arrow in FIG. 5B. At this time, the contact member 162C is maintained at the second pressure. Accordingly, the contact member 162C can maintain its initial position without being moved downward to the sensor part 162A even though the wafer chuck 11 is overdriven. Therefore, the soft member 162D is pricked with the probes 12A as shown in FIG. 6A, and needle marks 162F are transferred onto the upper surface of the soft member 162D as shown in FIG. 6B.

In addition to the above-described method of forming the needle marks 162F on the upper surface of the soft member 162D, the needle marks 162F may be formed on the soft member 162D as the contact member 162C is returned to its initial position by converting the first pressure into the second pressure in a state where the height of the tips of the probes 12A is already detected.

If the wafer chuck 11 is moved downward to a reference position thereof after the needle marks 162F are transferred onto the soft member 162D as described above, the upper CCD camera 13A is moved to the probe center by the alignment bridge 13C. Then, the wafer chuck 11 is again moved upward from the reference position, allowing the upper CCD camera 13A to detect the needle marks 162F on the soft member 162D as shown in FIG. 5C and FIG. 6B. In this way, it is possible to detect XY positions of a plural number of the probes 12A or, if necessary, all the probes 12A. Then, the respective XY coordinate data are stored in the memory part 14B. With these serial operations, the tip positions of the probes 12A, i.e. XYZ coordinate data, are acquired and used in the alignment of the semiconductor wafer W and the probes 12A.

Figure 5D:
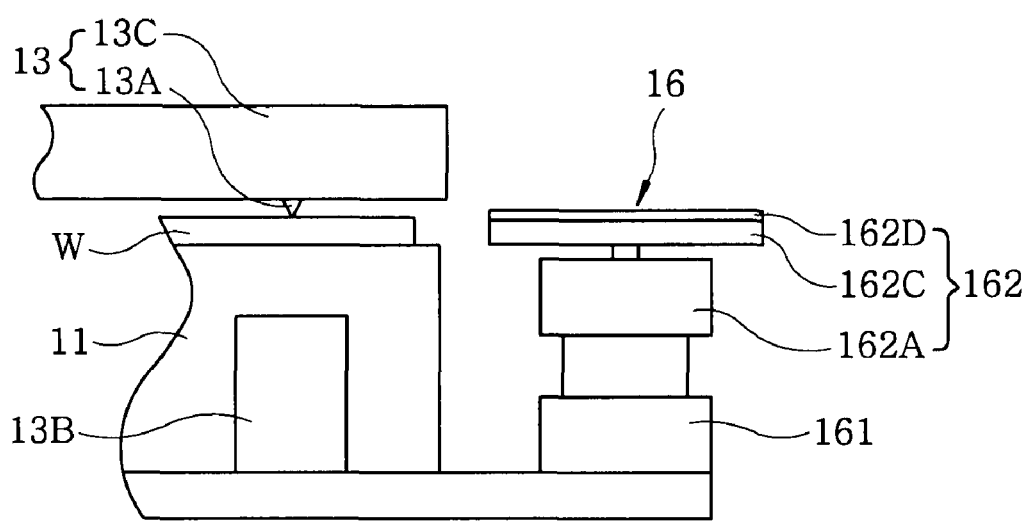

Upon implementation of the alignment, the wafer chuck 11 is moved along X- and Y-axes, so that, as shown in FIG. 5D, the upper CCD camera 13A detects electrode pads corresponding to the probes 12A at a plurality of positions of the semiconductor wafer W. X-Y coordinate data of the respective electrode pads are stored in the memory part 14B. With these serial operations, the alignment of the probes 12A and the semiconductor wafer W is completed. After completion of the alignment, the wafer chuck 11 is moved to an inspection beginning position and is moved upward from the inspection beginning position. Accordingly, as shown in FIG. 7, the electrode pads of an initial chip is made into contact with the probes 12A corresponding thereto, thereby performing an electric characteristic inspection. The semiconductor wafer W is index-fed by the wafer chuck 11 such that the electric characteristic inspection is performed on all chips of the semiconductor wafer W.

As described above, in accordance with the embodiment of the present invention, the tip positions of the probes 12A are detected by using the tip position detecting device 16 provided at the side of the wafer chuck 11. The tip position detecting device 16 includes the sensor unit 162 adapted to detect the tips of the probes 12A, and the sensor unit 162 includes the vertically movable contact member 162C. As the tip position detecting device 16 is moved upward from a Z-directional reference position thereof via the wafer chuck 11, the soft member 162D on the contact member 162C is made into contact with the tips of the probes 12A. Then, as the wafer chuck 11 is moved upward, the contact member 162C is moved downward to the sensor part 162A without bending of the probes 12A. Since a beginning position of the downward movement of the contact member 162C is detected as the tip positions of the probes 12A, the height of the tip positions of the probes 12A can be detected with a high accuracy in a state where the tips of the probes 12A maintain initial positions. Further, the height of the tips of the probes 12A can be surely detected regardless of the shape of the probes 12A.

After the tip positions of the probes 12A are detected by using the tip position detecting device 16, the tip positions of the probes 12A are again detected by using the lower CCD camera 13B. In this way, the probes 12A and the electrode pads corresponding thereto can be aligned with a high accuracy. Further, in the electric characteristic inspection of the electrode pads, the electrode pads are made into contact with the tips of the probes 12A with a high accuracy, thereby performing the accurate inspection with a desired overdrive operation. Accordingly, even when the probe card 12 has an extremely delicate arrangement according to an ultra fine structure of the semiconductor wafer W, the highly reliable inspection can be performed without damage to the probe card 12.

Even when the contact member 162C comes into contact with the probes 12A through the soft member 162D and then is moved downward to the sensor part 162A, the probes 12A do not cause damage to the soft member 162D. Therefore, the height of the tips of the probes 12A can be detected with a high accuracy without changing the initial positions of the tips of the probes 12A. In this case, the sensor part 162A detects the downward movement of the contact member 162C with a high accuracy, thereby enabling more accurate detection of the tip height.

Further, since the initial position of the contact member 162C is maintained at a higher pressure than a tip detection pressure during the alignment, the needle marks 162F of all the probes 12A can be surely transferred onto the upper surface of the soft member 162D as the probes 12A comes into contact with the soft member 162D. Accordingly, since all the needle marks 162F of the probes 12A can be transferred onto the soft member 162D, XY coordinate data of the probes 12A can be acquired based on the needle marks 162F of a plural number of the probes 12A or, if necessary, all the probes 12A, enabling an accurate alignment with XY coordinate data of the corresponding electrode pads. Therefore, a plural number of the probes 12A or, if necessary, all the probes 12A come into accurate contact with the corresponding electrode pads, thereby implementing a highly reliable inspection. Further, since the needle marks of the probes 12A are transferred onto the soft member 162D during the alignment, a complicated algorithm is not required and it is possible to reduce software development costs.

Second Embodiment

In the above-described probe apparatus 10 of the first embodiment, the soft member 162D of the tip position detecting device 16 is made of semi-transparent synthetic resin. Further, as described above, the soft member 162D has a limit to have a uniform thickness due to a variation in thickness and is deteriorated in smoothness after removal of the needle marks. Moreover, the soft member 162D may be pricked with the tips of the probes 12A upon detection of the tips of the probes 12A. Thus, it reduces detection accuracy of the tip positions of the probes 12A.

To solve the above-described problems, as shown in FIG. 8, the probe apparatus of the second embodiment has a feature in that the cylinder device of the first embodiment is divided into a cylinder device serving as a tip position detecting part to detect a height of the tips of the probes 12A and a cylinder device for a soft member (hereinafter, referred to as a transfer sheet in this embodiment) serving as a needle mark transfer part to transfer the needle marks of the probes 12A. Accordingly, it is possible to detect the tip positions of the probes 12A with a higher accuracy.

The probe apparatus of this embodiment, as shown in FIG. 8, includes a tip position detecting device 16A adapted to detect tip positions of the probes 12A of the probe card 12, and a needle mark transfer device 16B disposed adjacent to the tip position detecting device 16A to transfer needle marks of the probes 12A. The other configurations of this embodiment are substantially identical to those of the first embodiment.

The tip position detecting device 16A includes the elevation drive unit 161 such as an air cylinder and the sensor unit 162 which is moved upward and downward via the elevation drive unit 161. The tip position detecting device 16A has approximately the same configuration as that of the first embodiment except the following descriptions, and is configured to come into elastic contact with the probes 12A at a continuously constant pressure. Specifically, in this embodiment, the contact member 162C has no soft member provided on the upper surface thereof, and a hard material without being pricked with the probes 12A is exposed on the upper surface of the contact member 162C. Further, in the tip position detecting device 16A of this embodiment, the pressure applying tool is configured to set only a pressure corresponding to the first pressure, rather than adopting the pressure conversion between the first pressure and the second pressure as described in the first embodiment. Also, the contact member 162C has no heater.

Accordingly, in a state where the contact member 162C is maintained at a predetermined pressure, even if the contact member 162C comes into contact with the probes 12A as the tip position detecting device 16A is moved upward together with the wafer chuck 11, the contact member 162C is moved downward to the sensor part (not shown) while maintaining initial tip positions of the probes 12A without bending of the probes 12A. A position of the wafer chuck 11, from which the contact member 162C begins to be moved downward, indicates a height of the tips of the probes 12A.

The needle mark transfer device 16B, as shown in FIG. 8, includes a cylinder device 161', and a contact member 162C' configured to be moved upward and downward via a rod of the cylinder device 161' and having a soft member 162D'. The contact member 162C' is moved upward and downward between a standby position, which is slightly lower than the upper surface of the wafer chuck 11, and a position having approximately the same height as the upper surface of the wafer chuck 11, under operation of the cylinder device 161'. When the contact member 162C' is located at approximately the same height as the upper surface of the wafer chuck 11, needle marks of the probes 12A of the probe card 12 are transferred onto an upper surface of the soft member 162D'. The contact member 162C' includes a heater (not shown) therein.

In accordance with this embodiment, the height of the tips of the probes 12A is detected by the tip position detecting device 16A and needle marks of the probes 12A are transferred by the needle mark transfer device 16B. Accordingly, the height of the tips of the probes 12A can be surely detected with a high accuracy as the upper CCD camera 13A captures an image of the upper surface of the opaque contact member 162C of the tip position detecting device 16A. Further, there is no risk of the contact member 162C being pricked with the probes 12A, and the height of the tips of the probes 12A can be detected with a high accuracy without any negative effect due to a thickness variation or an uneven upper surface of the soft member.

Third Embodiment

As shown in FIG. 9A, a tip position detecting device 26 of the probe apparatus of the third embodiment includes, as a main component, e.g., a sensor unit 27 adapted to detect tips of the probes 12A. The sensor unit 27 includes a sensor body 271, a contact member 272 provided at the sensor body 271 to be vertically movable, and a pressure applying tool (electric regulator) 273 which applies a predetermined pressure to the contact member 272 such that the contact member 272 is spaced apart from the sensor body 271 by a predetermined distance. Under the predetermined pressure, the contact member 272 is moved to come into contact with the probes 12A and, then, is moved to the sensor body 271 due to a contact with the probes 12A, enabling detection of tip positions of the probes 12A. The sensor body 271 is constructed as an elastic supporting device (cylinder device) to elastically support the contact member 272 by the predetermined pressure. The electric regulator 273 is adapted to set elasticity of the cylinder device at a constant value. In the following description, the sensor body 271 is referred to as the cylinder device.

Herein, the cylinder device 271 and the electric regulator 273 will be described in detail. As shown in FIG. 9A, the cylinder device 271 and the electric regulator 273 are connected to each other via a first pipe 273A. The electric regulator 273 is further connected to a first air source 273B via the first pipe 273A, so that the first air source 273B supplies compressed air into the cylinder device 271 via the electric regulator 273. Accordingly, the electric regulator 273 supplies the compressed air from the first air source 273B into a cylinder 274 of the cylinder device 271, so as to set a predetermined air pressure in the cylinder 274. The cylinder device 271 elastically supports the contact member 272 at the predetermined pressure set by the electric regulator 273. The cylinder device 271 is made into contact with the probes 12A when the wafer chuck 11 is moved upward. While a predetermined pressure is maintained in the cylinder 274, even if a piston rod 275 is moved downward in the cylinder 274 as the contact member 272 connected to the piston rod 275 is moved downward, the compressed air in the cylinder 274 is discharged from an exhaust hole of the electric regulator 273. Thus, an interior pressure of the cylinder 274 is always maintained at an initially set pressure.

The cylinder device 271, as described above, includes the cylinder 274 and the piston rod 275 configured to be axially reciprocally moved in the cylinder 274 within a predetermined movement range. The inside of the cylinder 274 is defined as a lower piston receiving portion 274A and an upper rod receiving portion 274B, to receive the piston rod 275. The piston receiving portion 274A and the rod receiving portion 274B are separated from each other in an airtight state by a partition 274C. The partition 274C has a hole at the central thereof, so that a reduced diameter portion of the piston rod 275 passes through the hole. The piston rod 275 includes a piston portion 275A and a rod portion 275B, which are connected to each other via the reduced diameter portion.

The piston receiving portion 274A is formed in a size to allow the piston portion 275A to be axially movable within a predetermined range. The rod portion 275B is received in the rod receiving portion 274B and is axially slidable in the rod receiving portion 274B substantially without air leakage. The reduced diameter portion of the piston rod 275, as described above, slidably passes through the hole formed at the center of the partition 274C without air leakage.

The rod portion 275B is formed to have a length such that an upper end surface of the rod portion 275B is flush with an upper end surface of the cylinder 274 when the piston portion 275A is into contact with a bottom surface of the piston receiving portion 274A. As shown in FIG. 9A, if the piston portion 275A comes into contact with a top surface of the piston receiving portion 274A, the rod portion 275B protrudes from the upper end surface of the cylinder 274, causing the contact member 272 to be spaced apart from the cylinder 274. A driving space, into which compressed air is supplied to drive the piston rod 275, is formed between a lower surface of the rod portion 275B in the rod receiving portion 274B and the partition 274. The cylinder 274 has a first through hole 274D on its side surface, the first through hole 274D being formed in a diametrical direction and extending from the driving space to the outside. The electric regulator 273 is connected to the first through hole 274D via the first pipe 273A.

The cylinder 274 also has a second through hole 274E formed in a diametrical direction. The second through hole 274E is located slightly below the first through hole 274D and is opened to the piston receiving portion 274A. A position detecting device, which detects a current position of the piston rod 275, is connected to the second through hole 274E. The position detecting device includes a flow meter 276, a second pipe 276A and a second air source 276B. The flow meter 276 is connected to the second through hole 274E via the second pipe 276A. Compressed air is injected via a nozzle (measuring unit) (not shown) from the second through hole 274E onto an upper surface of the piston portion 275A in the piston receiving portion 274A. The flow meter 276 is configured to detect a distance between the upper surface of the piston portion 275A and the measuring unit based on a flow rate of the compressed air injected onto the upper surface of the piston portion 275A. Specifically, the flow rate of the compressed air supplied from the measuring unit increases or decreases in proportion to the distance between the measuring unit and the piston portion 275A. Accordingly, when the flow rate of the compressed air is measured by using the flow meter 276, the distance can be acquired with a high accuracy based on the measured flow rate. That is, the position detecting device in accordance with the present embodiment is configured as an air micrometer. The position detecting device monitors the current position of the piston rod 275 of the cylinder device 271.

For example, if the contact member 272 is made into contact with the probes 12A according to the upward movement of the wafer chuck 11 and then is moved downward to the cylinder device 271 due to the contact with the probes 12A, the upper surface of the piston portion 275A of the piston rod 275 is moved from a position shown in FIG. 9A, so as to be spaced apart from the measuring unit as shown in FIG. 9B. In this case, as the upper surface of the piston portion 275A is moved away from the measuring unit, the flow rate of the compressed air increases. The flow meter 276 measures the increased flow rate of the compressed air and sends a measurement signal to the controller 14. The controller 14 includes previously registered data regarding a relationship between the flow rate of the compressed air and the distance. If the measurement signal from the flow meter 276 is inputted into the controller 14, the operation processing part 14A of the controller 14 calculates the distance based on the measurement signal. If the distance is changed, the controller 14 detects a change beginning position as tip positions of the probes 12A.

As described above, also in the third embodiment, it is possible to surely detect the tip positions of the probes 12A in the same way as the first embodiment. Further, also in the third embodiment, since the contact member 272 has a hard upper surface, it is possible to surely detect the tip positions of the probes 12A with a high accuracy.

The present invention is not limited only to the above embodiments and, if necessary, the respective components can be appropriately altered. For example, the sensor unit used to detect a displacement of the contact member in the above embodiments may be replaced by other measurement devices, e.g., a capacity sensor, or laser measurement device.

The present invention is appropriately applicable to a probe apparatus for implementing electric characteristic inspection of an object to be inspected, such as a semiconductor wafer.

While the invention has been shown and described with respect to the embodiments, it will be understood by those skilled in the art that various changes and modification may be made without departing from the scope of the invention as defined in the following claims.

What is claimed is:

1. An alignment method for use in implementation of electric characteristic inspection of an object to be inspected via electric contact between the object disposed on a movable mounting table and probes, the alignment method being performed to align the object with the probes by using a first imaging unit movably arranged above the mounting table to capture an image of the object, a second imaging unit mounted to the mounting table to capture an image of the probes, and a tip position detecting device mounted to the mounting table to detect tips of the probes, the alignment method comprising:
   detecting tip positions of the probes by using the tip position detecting device;
   detecting the tip positions of the probes, which have been detected by the tip position detecting device, by using the second imaging unit;
   transferring needle marks of the probes onto a soft member provided at the tip position detecting device by allowing the probes to come into contact with the soft member;
   detecting the needle marks of the probes formed on the soft member by using the first imaging unit; and
   detecting inspection electrodes of the object corresponding to the probes by using the first imaging unit.

2. The alignment method of claim 1, wherein the tip position detecting device includes a sensor unit to detect the tips of the probes, and a vertically movable contact member belonging to the sensor unit, and
   wherein said detecting tip positions of the probes includes:
   moving the tip position detecting device via a movement of the mounting table to allow the contact member to come into contact with the tips of the probes;
   moving the contact member toward the sensor unit via a further movement of the mounting table without bending of the probes; and
   detecting a movement beginning position of the contact member as the tip positions of the probes.

3. The alignment method of claim 2, wherein in said moving the contact member, the probes do not cause damage to the soft member.

4. The alignment method of claim 2, wherein in said moving the contact member, a current position of the contact member is detected by using a displacement sensor.

5. The alignment method of claim 4, wherein in said detecting a movement beginning position, the tip positions of the probes are detected based on a detected result of the displacement sensor.

6. A tip position detecting device for use in implementation of electric characteristic inspection of an object to be inspected via electric contact between the object and probes, the tip position detecting device being used to detect tip positions of the probes,
   wherein the tip position detecting device includes a sensor unit to detect tips of the probes,
   wherein the sensor unit includes a sensor body, a contact member provided at the sensor body to be vertically movable, and a pressure applying tool to apply a predetermined pressure to the contact member such that the contact member is spaced apart from the sensor body by a predetermined distance,
   wherein the sensor body includes an elastic supporting device to elastically support the contact member with the predetermined pressure applied by the pressure applying tool, and
   wherein the contact member is moved downward to the sensor body when it comes into contact with the probes under the predetermined pressure, enabling detection of the tip positions of the probes.

7. The tip position detecting device of claim 6, wherein the sensor unit includes a displacement sensor to detect a current position of the contact member.

8. A probe apparatus comprising a movable mounting table on which an object to be inspected is disposed, probes arranged above the mounting table, and a tip position detecting device provided at the mounting table to detect tip positions of the probes,
   wherein the tip position detecting device includes a sensor unit to detect tips of the probes,
   wherein the sensor unit includes a sensor body, a contact member provided at the sensor body to be vertically movable, and a pressure applying tool to apply a predetermined pressure to the contact member such that the contact member is spaced apart from the sensor body by a predetermined distance,
   wherein the sensor body includes an elastic supporting device to elastically support the contact member with the predetermined pressure applied by the pressure applying tool, and
   wherein the contact member is moved downward to the sensor body when it comes into contact with the probes under the predetermined pressure, enabling detection of the tip positions of the probes.

9. The probe apparatus of claim 8, further comprising a needle mark transfer device provided at the mounting table to transfer needle marks of the probes.

10. The probe apparatus of claim 8, wherein the sensor unit includes a displacement sensor to detect a current position of the contact member.

11. The probe apparatus of claim 9, wherein the needle mark transfer device includes a detachable soft member.

12. The probe apparatus of claim 9, wherein the needle mark transfer device includes a contact member to which the soft member is detachably attached, and an elevation drive unit which supports the contact member to be vertically movable.

* * * * *